United States Patent
Lotz

(10) Patent No.: US 6,380,022 B1
(45) Date of Patent: Apr. 30, 2002

(54) METHOD FOR CREATING A USEFUL BIOPOLAR JUNCTION TRANSISTOR FROM A PARASITIC BIPOLAR JUNCTION TRANSISTOR ON A MOSFET

(75) Inventor: Jonathan P Lotz, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/553,723

(22) Filed: Apr. 20, 2000

(51) Int. Cl.$^7$ ........................................... H01L 21/8249
(52) U.S. Cl. ....................... 438/234; 438/202; 257/378; 257/394
(58) Field of Search ................................ 438/234, 149, 438/170, 202; 257/378, 394

(56) References Cited

U.S. PATENT DOCUMENTS

| | | | |
|---|---|---|---|
| 4,954,989 A | * | 9/1990 | Auberton-Herve et al. . 365/177 |
| 5,770,881 A | * | 6/1998 | Pelella et al. ................ 257/347 |
| 5,872,032 A | * | 2/1999 | Chi et al. .................... 438/238 |
| 6,060,742 A | * | 5/2000 | Chi et al. .................... 257/316 |
| 6,128,216 A | * | 10/2000 | Noble, Jr. et al. ........... 365/154 |

FOREIGN PATENT DOCUMENTS

EP            440331 A2 * 8/1991

OTHER PUBLICATIONS

Colinge, "An SOI Voltage-Controlled Bipolar-MOS Device," IEEE Transaction on Electron Devices, vol. ED-34, No. 4, Apr. 1987, pp. 845-849.*

* cited by examiner

Primary Examiner—Trung Dang

(57) ABSTRACT

The present invention creates a useful BJT by increasing the gain associated with the parasitic BJT on an SOI or bulk type MOSFET. This is done by masking those manufacturing steps that minimize the BJT's beta value, by intentionally increasing the beta value of the BJT, and by driving the base of the BJT with the circuit. Once the gain is increased sufficiently, the BJT may be used productively in the circuit. Because the physical structure of the BJT is already part of the silicon water, its productive use does not require additional space.

12 Claims, 8 Drawing Sheets

METHOD FOR CREATING A USEFUL BIOPOLAR JUNCTION TRANSISTOR FROM A PARASITIC BIPOLAR JUNCTION TRANSISTOR ON A MOSFET

TECHNICAL FIELD

The present invention relates generally to metal oxide semiconductor ("MOS") devices. More particularly, the present invention relates to a method for creating a useful bipolar junction transistor ("BJT") from a parasitic BJT on a MOS device.

BACKGROUND

Because of the pn junctions which are created in the manufacture of MOS devices, a parasitic BJT is formed during manufacture of a MOS field effect transistor ("FET"). The parasitic BJT is connected in parallel to the MOSFET, because emitter, base and collector of the BJT are formed from the source, channel and drain, respectively, of the MOSFET. The parasitic BJT is formed from the "n" and "p" type materials that are used in the different regions of the MOSFET. That is, an n-channel MOSFET would have a parasitic npn-type BJT associated with it and a p-channel MOSFET would have an associated parasitic pnp-type BJT.

The parasitic BJT may create unwanted effects during the operation of the MOS device. Because the base of the parasitic BJT is electrically connected to the channel of the MOSFET, it is floating and the device is more difficult to control. A floating base causes a history dependent delay, which changes the MOS characteristics. This is particularly a problem with silicon-on-insulation ("SOI") MOS field effect devices, because the channel of the MOSFET is isolated from the substrate, as explained further herein (e.g., see FIG. 2).

The manufacturing process for MOSFETs currently requires steps designed to nullify the effect of the parasitic BJT. Clearly, a method that would transform the parasitic BJT into a useable BJT would be desirable.

SUMMARY

One embodiment of the present invention relates to a method for creating a useful BJT by increasing the gain associated with the parasitic BJT on an SOI or bulk type MOSFET to a desired level. Once the gain is increased sufficiently, the BJT may be used productively in the circuit by driving the base of the BJT with the circuit. Because the physical structure of the BJT is already part of the silicon wafer, its Productive use does not require additional space.

One embodiment of the MOS device of the present invention comprises a useful BJT that is formed from a parasitic BJT, connected in parallel to the MOS device

DETAILED DESCRIPTION

Currently, designers of SOI MOSFETs seek to minimize the effect of the parasitic BJT on the operation of the MOSFET. The problems with the industry's current approach is that it fails to use this existing circuit element productively. The present invention takes an entirely different approach to handling the parasitic BJT and solves this problem by designing the BJT into the circuit as a useful device, rather than treating it as a problem that must be minimized.

The parasitic BJT has the potential to become a useful circuit element when designed and used differently. Rather than minimizing the beta value and killing the gain, as is currently done, the present invention increases the beta value or selected parasitic BJTs and uses those BJTs as circuit elements connected in parallel with the MOSFET.

Figure 1A:
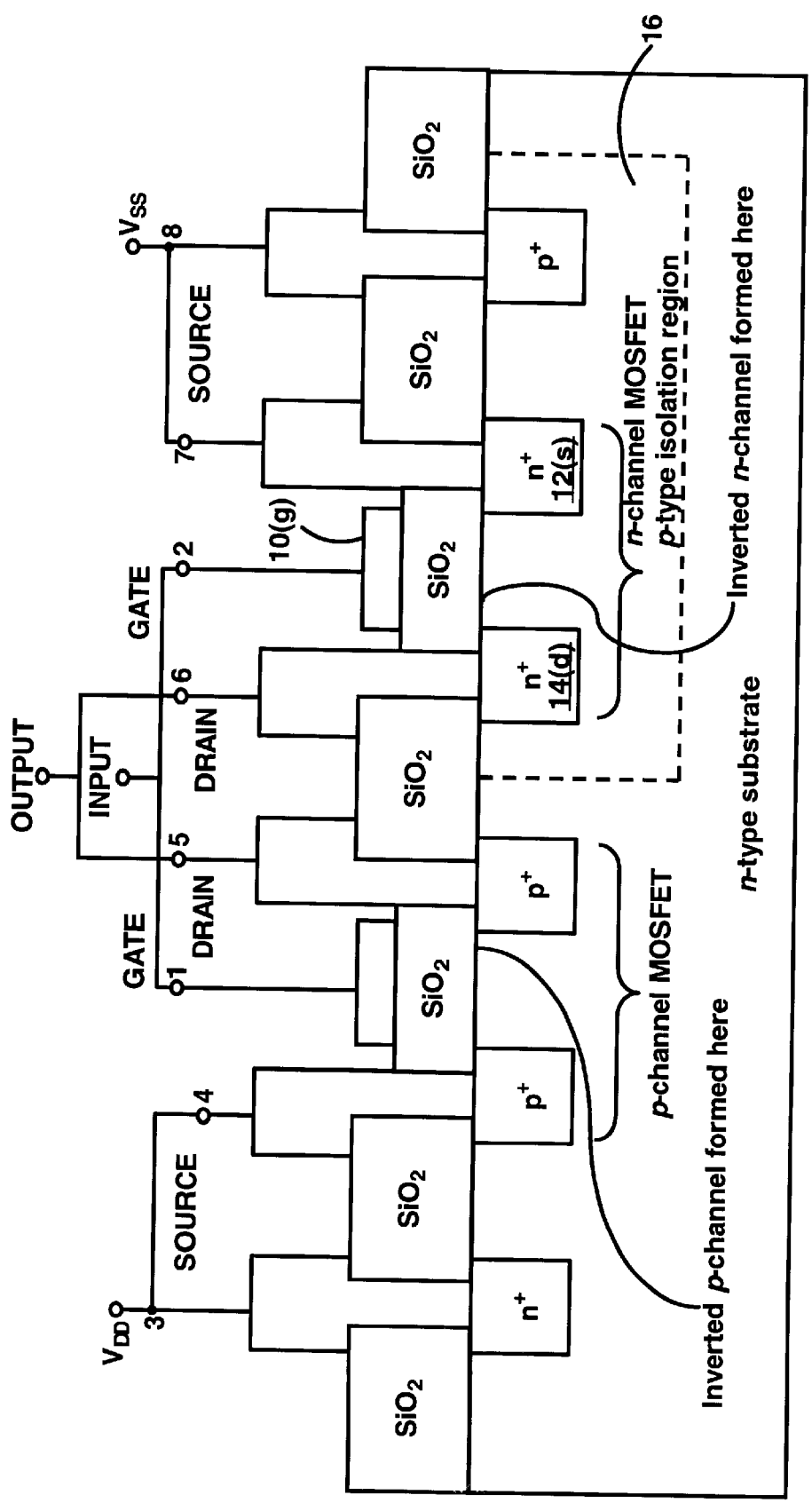
FIG. 1a illustrates the typical cross section of a complimentary metal-oxide semiconductor ("CMOS") having n-channel and p-channel MOSFETs on the same chip.
Figure 1B:
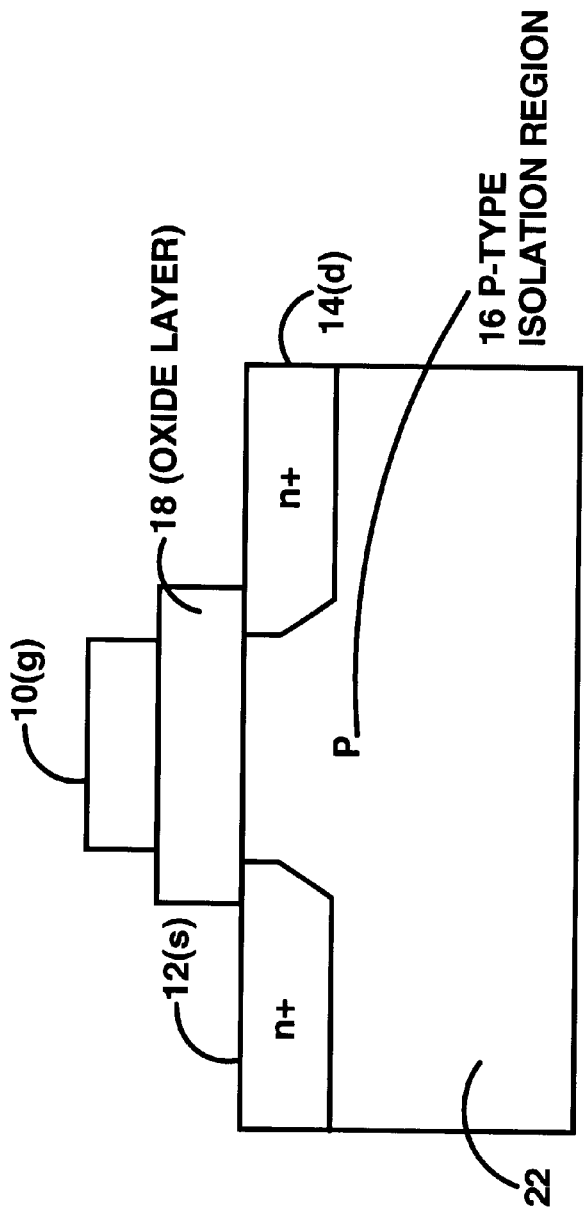
FIG. 1b illustrates a portion of FIG. 1a, corresponding to the physical structure of the bulk type n-channel MOSFET.
Figure 2:
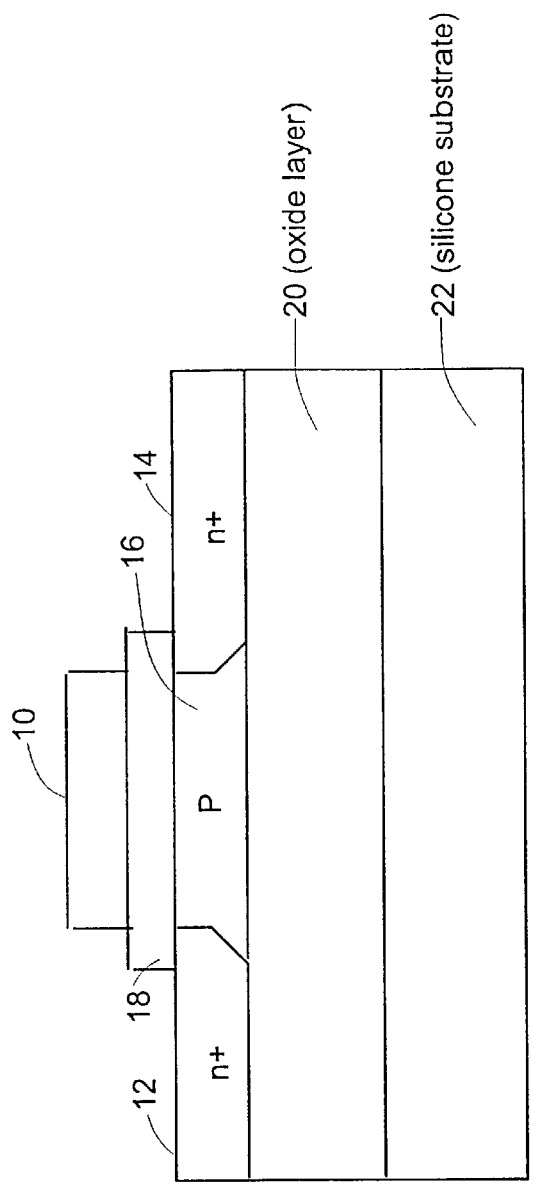
FIG. 2 illustrates the physical structure of a silicon-on-insulation ("SOI") n-channel MOSFET.

FIG. 1a shows a prior art complementary metal-oxide semiconductor ("CMOS")in which n-channel and p-channel MOSFETs are fabricated on the same chip. The present invention can be used to enhance the performance of either or both of the n-channel and p-channel MOSFETs in a CMOS device. FIG. 1b represents an n-channel MOSFET or the n-channel side of a MOSFET on a CMOS device. FIG. 2 shows an n-channel SOI MOSFET. The embodiment shown in FIG. 1b comprises a silicon substrate (also referred to as "body region" or "body contact") 22, which forms a channel 16. N-type impurities are diffused laterally on each side of the channel 16 to form a source 12 and a drain 14 of the MOSFET. An oxide layer 18 is formed above the channel 16 and separates the channel 16 from the gate 10. Variations of this model for MOSFETs and their manufacturing processes are known to those skilled in the art.

FIG. 2 illustrates the physical structure of an SOI MOSFET. The SOI MOSFET illustrated is of the n-type, having a source 12 and a drain 14 both formed from diffused n-type impurities, separated by a channel 16. It likewise has a gate 10 separated from the channel 16 by an oxide layer 18. The substrate 22 is silicon, as with the bulk type MOS device of FIG. 1. Unlike the bulk type device, the SOI MOSFET has an oxide layer 20 which separates the substrate 22 from the source 12, the channel 16, and the drain 14.

Figure 3:
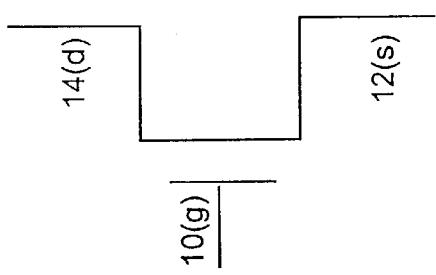
FIG. 3 is a circuit diagram of an idealized MOSFET.
Figure 4:
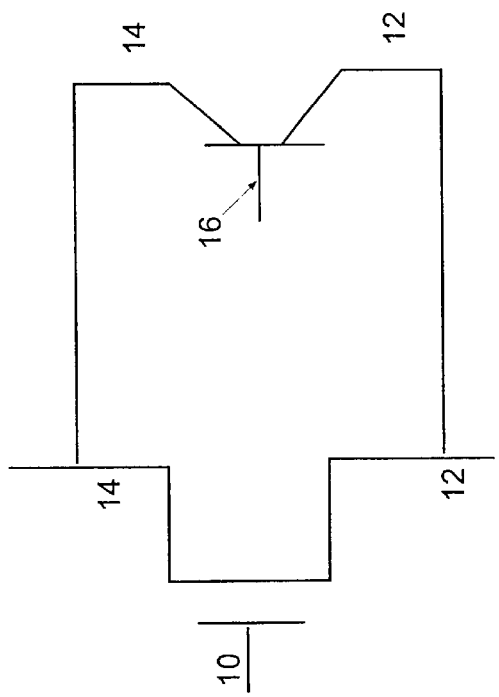
FIG. 4 is a circuit diagram of a MOSFET showing the parasitic BJT connected in parallel with the MOSFET.

FIG. 3 is an idealized circuit diagram of the MOSFET of either FIG. 1 or 2, showing a source 12, gate 10, and drain 14. In operation, however, the device of either FIG. 1b or 2 also contains a parasitic BJT in parallel with the MOSFET. The parasitic BJT is formed from the n-typed p-type regions used to create the 12, channel 16, and source 14 of the BJT. FIG. 4 is a circuit diagram illustrating the parasitic BJT as part of the MOSFET. The source 12 of the MOSFET forms the emitter of the BJT, and the channel 16 of the MOSFET forms the base of the BJT and the drain 14 of the MOSFET forms the collector of the BJT.

Figure 5:
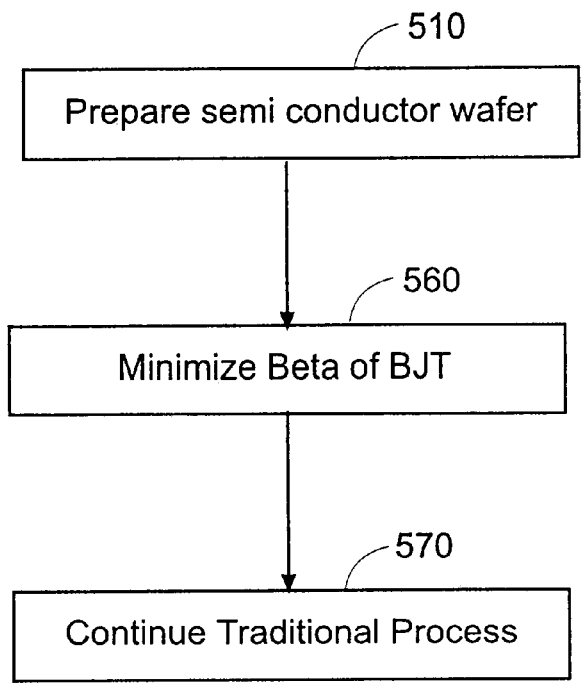
FIG. 5 represents the prior art method of manufacturing a MOSFET during which the beta of the BJT is minimized with the resulting diminution of the gain of the transistor.

As shown in FIG. 5, the common approach in the industry is to minimize the effect of the parasitic BJT during manufacture of the MOSFETs. One approach to minimizing the effect of the parasitic BJT is to lower its beta value and thus lower its gain. A variety of methods are known in the industry to kill the gain, including the use of implants into the junctions. For example, source 12 and the drain 14 regions may be doped with elements such as argon or germanium. This doping decreases the emitter efficiency of the parasitic BJT, which decreases its beta value, which in turn decreases the gain of the parasitic BJT.

Additionally, the manufacturing process for a SOI MOSFET of the type shown in FIG. 2 may include tying off the base 16 of the BJT, for example to the body region 22. This requires making an electrical connection between the channel 16 of the MOSFET and the body region 22 or to ground (not shown). Tying off the base 16 of the parasitic BJT requires an additional manufacturing step. Also, this process requires additional chip resources, because the connection to the body region 22 requires more physical area on the chip. Tying off the base 16 also decreases the MOSFET's performance, because the channel 16 is no longer isolated from the body region 22 in an SOI MOSFET.

Figure 6:
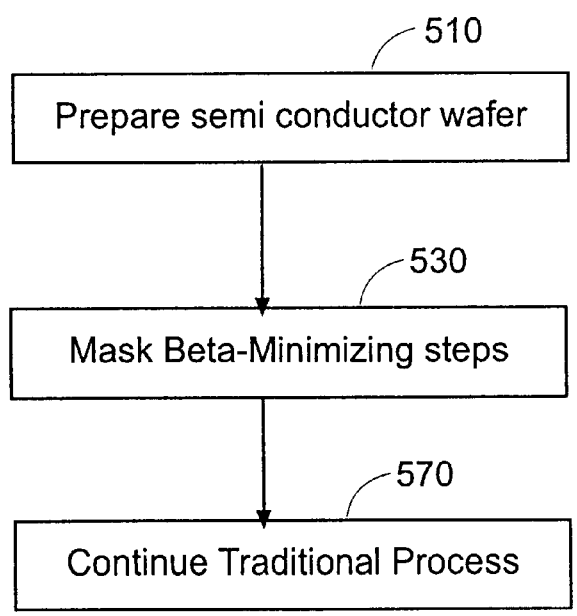
FIG. 6 shows one of the possible changes to the manufacturing process in which the beta minimizing steps are masked during the manufacturing process.
Figure 7:
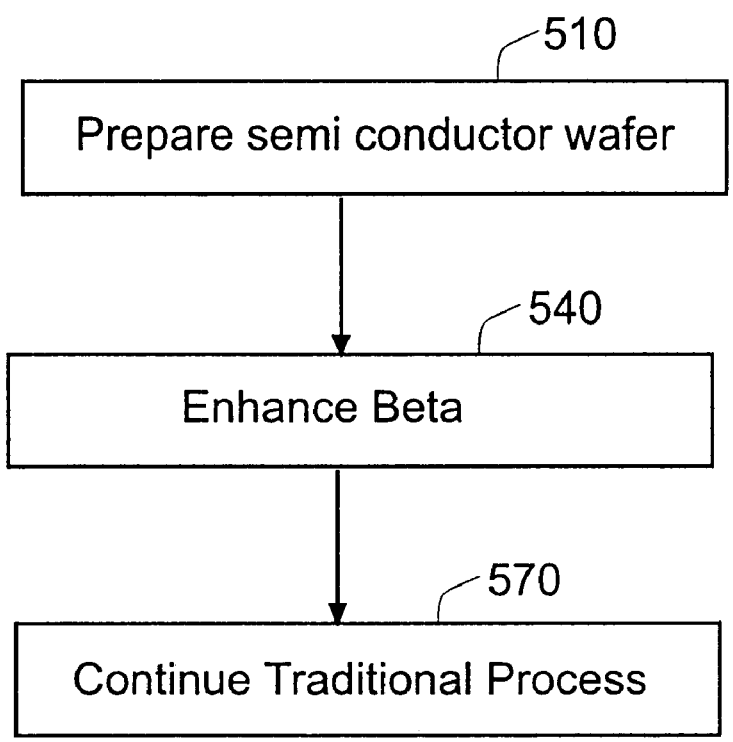
FIG. 7 shows a similar process during which the beta minimizing steps are altered to enhance the beta of the BJT or, after the beta minimizing steps have been masked, additional steps are taken to enhance the beta of the BJT.

FIG. 6 shows a manufacturing method of the present invention for creating a useful BJT from a parasitic BJT of a MOSFET. Block 510 represents the known methods for preparing the semiconductor wafer to create MOSFETs. If a useful BJT is desired, then any manufacturing techniques that would minimize the beta value of the BJT, or otherwise decrease the gain would be masked with respect to those respective MOSFETs (block 530) in which a useful BJT is desired. In other words, if the source 12 and/or drain 14 regions are normally subjective to doping, with elements such as argon or germanium, these doping steps are masked so that the gain is not minimized.

As an alternative, or as an additional step, either the doping steps which would normally utilize argon or germanium might be changed to dope the source 12 and drain 14 with elements which will enhance the beta of the emitter efficiency. Or, after the doping steps have been masked, other doping or well-known techniques may be used to actually enhance the beta of the bipolar transistor. These processes would be used to increase the gain for selected parasitic BJTs to a desired level (e.g., increase the beta value) (represented by Block 540).

It should be appreciated that certain applications of the present invention will not require both of the techniques depicted in block 530 and 540. For example, it may be sufficient to mask the beta minimizing processes, as shown in block 530, without also affirmatively increasing the beta value in a separate act as shown in block 540. Conversely, in a particular application it may be sufficient to not mask beta minimizing steps, as shown in block 530, but instead to alter those steps or to perform other steps to increase the beta of the parasitic BJT, as shown in block 540. In still other applications it may be desirable to both mask the beta minimizing techniques (block 530) and to actively increase the beta value (block 540).

Figure 8:
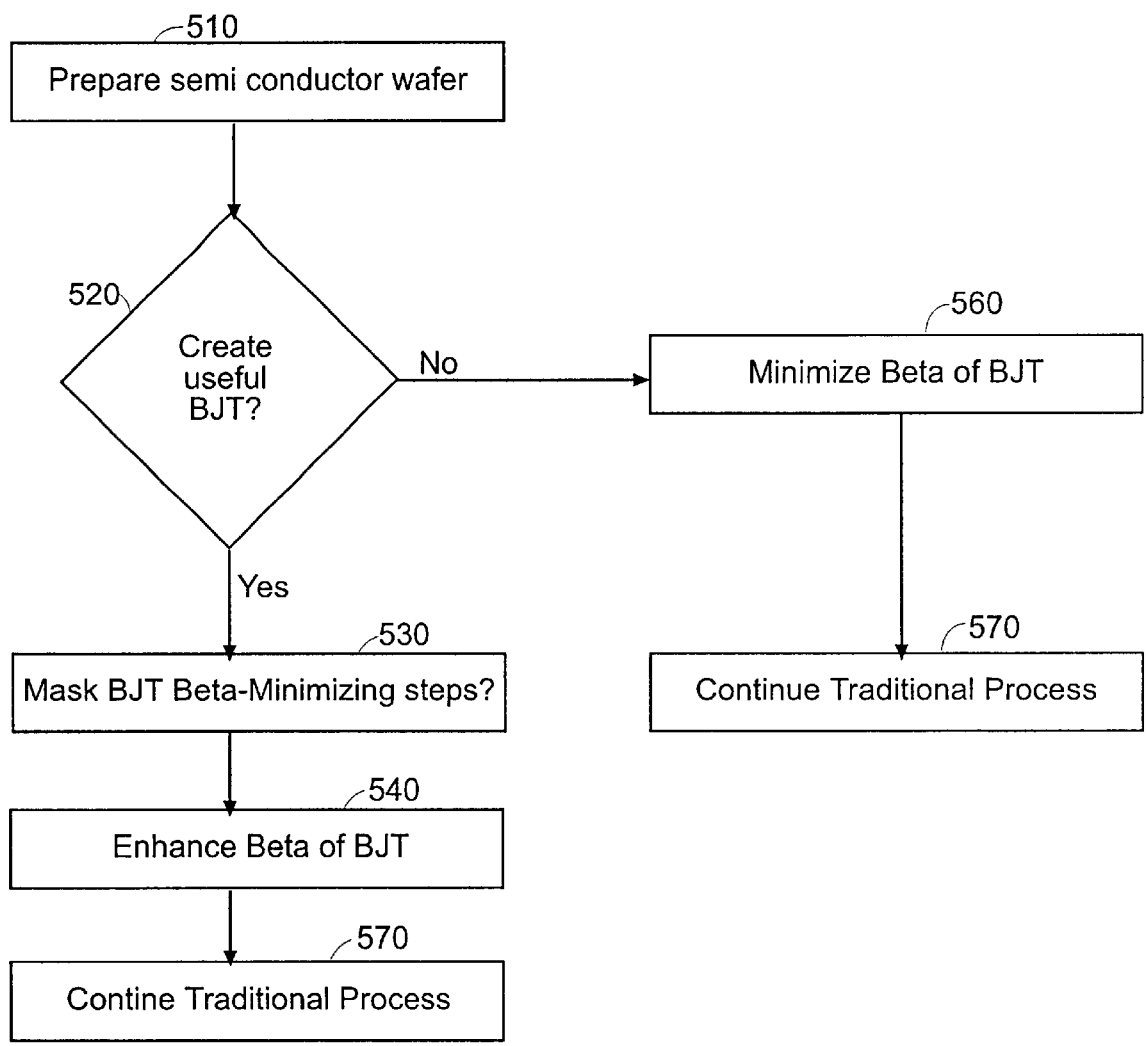
FIG. 8 is a block diagram showing an automated method of manufacturing a MOSFET during which an election is made during the manufacturing process as to whether a useful BJT shall be from the inherent parasitic BJT formed during the manufacturing process.

FIG. 8 represent an automated process which alters the traditional process wherein during the manufacturing process for each MOSFET, a decision is made (520) as to whether or not the BJT associated with that MOSFET shall be minimized or enhanced. If it is to be minimized, the traditional process (560, 570) is followed. If a useful BJT is desired then either the beta minimizing steps are masked (530) or the beta is enhanced (540) or both steps are pursued (530, 540) before continuing the traditional process (570).

Figure 9:
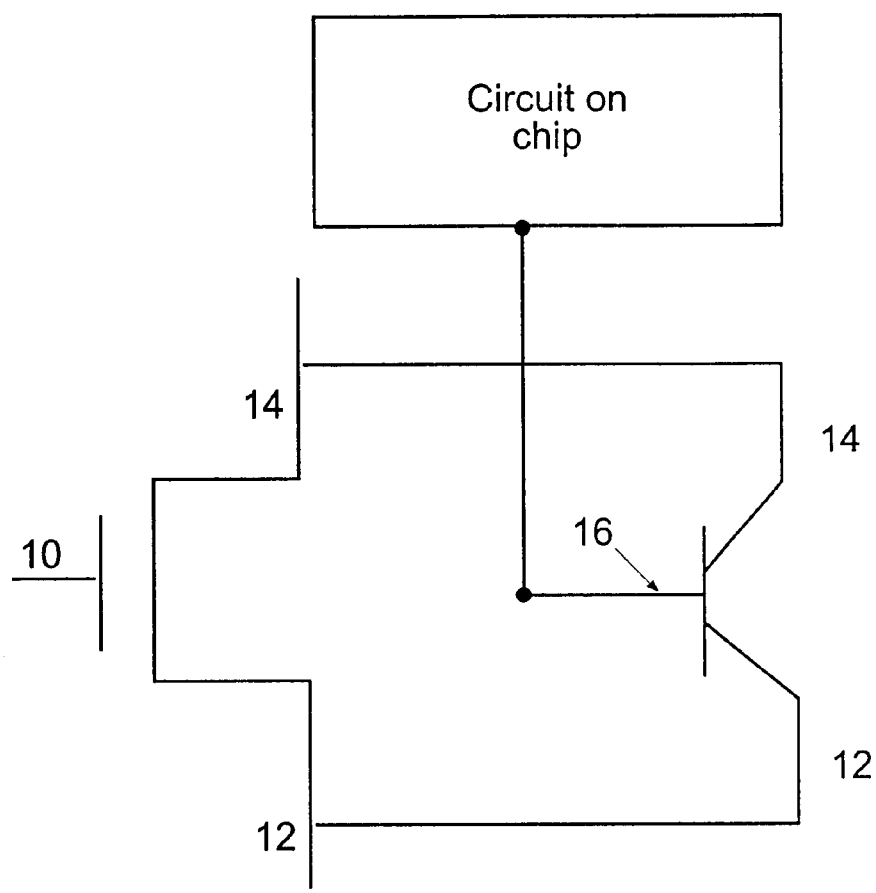
FIG. 9 shows a representative circuit connection to the enhanced BJT which results when practicing the instant invention.

As shown in FIG. 9, once the gain of the BJT is provided to the desired level, the base 16 of the BJT may be driven by the circuit, so that it may be used as a functioning component in the circuit. The driving of the base 16 of the BJT (also the channel 16 of the MOSFET) is facilitated by making an electrical connection between the base 16 and the desired circuit elements. Techniques for making such a connection are known in the art. For example, the masking process may include specific masks to create such a connection in the same or similar way that such masks may create connections between other terminals of the MOSFET and other circuit elements. In particular, traditional BiCMOS techniques may be used. If the parasitic BJT is not to be used in the circuit, then the current process of minimizing the gain by minimizing the beta value is undertaken, as shown in Block 560. A silicon wafer will have a plurality of MOSFETs. Based on the chip design, the gain of the parasitic BJT on different selected MOSFETs may be provided to different desired levels. On other MOSFETs parasitic BJTs, the gain will be minimized, as is currently desired. Also, using the teaching of this invention, all the parasitic BJTs on a wafer may be transformed into useable BJTs.

Although the preset invention has been described in detail with reference to certain embodiments thereof, variations are possible. For example, the MOSFET may be a p-type MOSFET, with a corresponding pnp-type BJT. Also, the MOSFET need not be an SOI MOSFET. Bulk type MOS devices may also be used, with modifications known to those in the art. In particular, in a bulk type MOSFET the channel 16 of the MOSFET must be isolated from the substrate 22. This may be done using a well (not shown) or other methods known to those skilled in the art. Therefore, the present invention may be embodied in other specific forms without departing from the essential spirit or attributes thereof. The embodiments described herein should be considered in all respects as illustrative, not restrictive, and reference should be made to the claims for determining the scope of the invention.

I claim:

1. A method of creating at least one useful bipolar junction transistor (BJT) from parasitic BJTs formed during the manufacture of a plurality of metal oxide semiconductor field effect transistor (MOSFET) devices on a silicon wafer, comprising:

providing a gain to a desired level on selected ones of the parasitic BJTs; and providing a circuit connection to the selected parasitic DJTs, thereby making the selected parasitic BJTs useful circuit elements, wherein the step of providing a gain to a desired level further comprises:

masking any manufacturing process designed to minimize a beta value of the selected parasitic BJTs.

2. The method of claim 1, wherein the MOSFET is a silicon-on-insulation (SOI) MOSFET.

3. The method of claim 2, wherein the MOSFET has a channel and a substrate, further comprising isolating the channel from the substrate.

4. The method of claim 3, wherein the step of providing a gain to a desired level on the parasitic BJT comprises increasing the gain of the parasitic BJT.

5. The method of claim 4, wherein the step of increasing the gain on the parasitic BJT comprises increasing the beta value of the parasitic BJT.

6. A method of creating at least one useful bipolar junction transistor (BJT) from parasitic BJTs on silicon-on-insulation (SOI) metal oxide semiconductor field effect transistors (MOSFET) in a circuit, comprising:

provided a gain to a desired level on selected ones of the parasitic BJTs; and providing a circuit connection to drive the base of the selected parasitic BJTs with the circuit, thereby making the selected parasitic BJTs useful circuit elements, wherein the step of providing a gain to a desired level further comprises:

masking any manufacturing process designed to minimize a beta value of the selected parasitic BJTs.

7. An improved method of manufacturing metal oxide semiconductor (MOS) devices wherein one of the steps of the manufacturing process is minimizing a beta value of parasitic bipolar junction transistors (BJTs) formed by pn junctions in the MOS devices, the improvement comprising:

selectively masking the beta minimizing steps for at least one of said parasitic BJTs so that said at least one BJT is a useful circuit element.

8. The manufacturing process of claim 7 wherein the improvement further comprises enhancing the beta of the parasitic BJT so that the BJT can be used as a useful circuit element.

9. An improved method of manufacturing metal oxide semi-conductor (MOS) devices, wherein one of the steps of the manufacturing process is minimizing a beta of parasitic bipolar junctions transistors (BJTs) formed by the pn junctions in the MOS devices, the improvement comprising:

selectively altering the beta minimizing steps to enhance the beta of at least one of said parasitic BJTs so that said at least one BJT is manufactured as a useful circuit element.

10. A silicon wafer having a plurality of metal oxide semiconductor field effect transistor (MOSFET) devices, wherein at least one of said devices comprises:

at least one useful bipolar junction transistor (BJT) created from parasitic BJTs formed during a manufacture of the MOSFET devices, the useful BJT being electrically connected to a circuit element wherein selective ones of the parasitic BJTs are made useful by increasing a beta by masking any manufacturing process designed to minimize the beta of the selected parasitic BJTs.

11. The device of claim 10, wherein the MOSFET device is a silicon-on-insulation (SOI) MOSFET.

12. The device of claim 10, wherein the MOSFET is a bulk-type MOSFET with a channel and a substrate and further comprising a well for isolating the channel from the substrate.

* * * * *

UNITED STATES PATENT AND TRADEMARK OFFICE
CERTIFICATE OF CORRECTION

PATENT NO.   : 6,380,022 B1
DATED        : April 30, 2002
INVENTOR(S)  : Jonathan P. Lotz It is certified that error appears in the above-identified patent and that said Letters Patent is hereby corrected as shown below:

<u>Column 4,</u>
Line 25, delete "preset" and insert therefor -- present --.

<u>Column 5,</u>
Line 50, delete "DJTs" and insert therefor -- BJTs --

Signed and Sealed this

Thirteenth Day of July, 2004

JON W. DUDAS
*Acting Director of the United States Patent and Trademark Office*